(12) United States Patent
Furuta

(10) Patent No.: US 12,074,067 B2
(45) Date of Patent: Aug. 27, 2024

(54) WAFER DIVIDING METHOD AND DIVIDING APPARATUS

(71) Applicant: DISCO CORPORATION, Tokyo (JP)

(72) Inventor: Kenji Furuta, Tokyo (JP)

(73) Assignee: DISCO CORPORATION, Tokyo (JP)

(*) Notice: Subject to any disclaimer, the term of this patent is extended or adjusted under 35 U.S.C. 154(b) by 149 days.

(21) Appl. No.: 17/648,460

(22) Filed: Jan. 20, 2022

(65) Prior Publication Data

US 2022/0238379 A1 Jul. 28, 2022

(30) Foreign Application Priority Data

Jan. 27, 2021 (JP) ................................ 2021-011006

(51) Int. Cl.
*H01L 21/782* (2006.01)
*B23K 26/50* (2014.01)
*H01L 21/683* (2006.01)

(52) U.S. Cl.
CPC ............ *H01L 21/782* (2013.01); *B23K 26/50* (2015.10); *H01L 21/6836* (2013.01)

(58) Field of Classification Search
CPC ... H01L 21/782; H01L 21/6836; H01L 21/78; B23K 26/50
See application file for complete search history.

(56) References Cited

U.S. PATENT DOCUMENTS

2006/0016443 A1* 1/2006 Ohmiya ............... B28D 5/0011
125/12

FOREIGN PATENT DOCUMENTS

| JP | H1090161 A | * | 4/1998 |
| JP | 2002192370 A | | 7/2002 |
| JP | 2020096177 A | | 6/2020 |

OTHER PUBLICATIONS

Machine Translation of JPH1090161A (Year: 1998).*

* cited by examiner

*Primary Examiner* — Yara B Green
*Assistant Examiner* — Fakeha Sehar
(74) *Attorney, Agent, or Firm* — Greer Burns & Crain Ltd.

(57) ABSTRACT

A wafer dividing method includes forming modified layers which will be starting points of division, integrally attaching an annular frame and the wafer together through a dicing tape, directing the wafer downward and expanding the dicing tape to divide, into individual device chips, the wafer along the modified layers formed along the streets, counting particles scattered at the time of division of the wafer by a particle counter disposed in a dust collection path set directly below the wafer, and determining, on the basis of the number of the particles, whether or not the modified layers have been properly formed, at the time of carrying out the dividing step.

6 Claims, 7 Drawing Sheets

WAFER DIVIDING METHOD AND DIVIDING APPARATUS

BACKGROUND OF THE INVENTION

Field of the Invention

The present invention relates to a wafer dividing method for dividing, into individual device chips, a wafer formed on a front surface thereof with a plurality of devices partitioned by a plurality of intersecting streets and a dividing apparatus suitable for the dividing method.

Description of the Related Art

A wafer formed on a front surface thereof with a plurality of devices such as integrated circuits (ICs) and large scale integrated circuits (LSIs) partitioned by a plurality of intersecting streets is divided into individual device chips by a laser beam of such a wavelength as to be transmitted through the wafer being applied to the wafer with a condensing point of the laser beam positioned to the inside of the wafer corresponding to the streets, to form modified layers which will become starting points of division, and an external force being exerted on the wafer. The thus divided device chips are used for electric apparatuses such as mobile phones and personal computers (see, for example, Japanese Patent No. 3408805).

Incidentally, when the external force is exerted on the wafer to divide the wafer into the individual device chips, upon division, fine particles (particles) are scattered from the modified layers serving as the starting points of division, and are dropped and deposited on the front surface of the wafer, lowering the quality of the device chips. In view of this, a technology by which the wafer is divided in a downwardly directed state such that the scattered particles are prevented from being deposited on the device chips has been proposed by the present applicant (see Japanese Patent Laid-open No. 2020-096177).

SUMMARY OF THE INVENTION

Here, in the case where an external force is exerted on the wafer to divide the wafer into individual device chips, using the technology described in Japanese Patent No. 3408805, whether or not the modified layers have been properly formed can be determined by checking the number and state of the particles dropped on the front surface of the wafer. On the other hand, in the case of the technology described in Japanese Patent Laid-open No. 2020-096177, since the wafer is divided in a downwardly directed state, particles are not dropped and deposited on the front surface of the wafer, so that whether or not the modified layers have been properly formed in the wafer cannot be checked after the division.

Accordingly, it is an object of the present invention to provide a wafer dividing method and a dividing apparatus by which whether or not modified layers have been properly formed in the wafer can be checked after division of the wafer, even in the case where the wafer is divided in such a manner that scattered particles are not deposited on the front surface of the wafer.

In accordance with an aspect of the present invention, there is provided a wafer dividing method for dividing, into individual device chips, a wafer formed on a front surface thereof with a plurality of devices partitioned by a plurality of intersecting streets, the wafer dividing method including a modified layer forming step of applying a laser beam of such a wavelength as to be transmitted through the wafer to the wafer while positioning a condensing point of the laser beam to an inside of the wafer corresponding to the streets, to form modified layers that will be starting points of division, a frame disposing step of positioning the wafer at an opening of a frame provided in a center thereof with the opening for accommodating the wafer, and integrally attaching the frame and the wafer together through a dicing tape, before or after the modified layer forming step, a dividing step of directing the wafer downward, and expanding the dicing tape to divide, into individual device chips, the wafer along the modified layers formed in the inside of the wafer corresponding to the streets, and a determining step of counting particles scattered at the time of division of the wafer by a particle counter disposed in a dust collection path set directly below the wafer, and determining, on the basis of the number of the particles, whether or not the modified layers have been properly formed, at the time of carrying out the dividing step.

In accordance with another aspect of the present invention, there is provided a wafer dividing apparatus for positioning a wafer at an opening of a frame provided in a center thereof with the opening for accommodating the wafer, integrally attaching the frame and the wafer together through a dicing tape, and dividing, into individual device chips, the wafer formed with starting points of division along a plurality of intersecting streets partitioning a plurality of devices, the dividing apparatus including frame holding means that holds the frame with the wafer directed downward, dividing means for expanding the dicing tape present between the frame and the wafer, to divide the wafer into the individual device chips, and a particle counter that is disposed in a dust collection path set directly below the wafer and counts particles scattered at the time of dividing the wafer.

Preferably, the dividing apparatus further includes a determining section that is connected to the particle counter and determines, on the basis of the number of particles counted by the particle counter, whether or not modified layers have been properly formed.

According to the wafer dividing method of the present invention, whether or not the wafer is divided after the modified layers have been properly formed in the modified layer forming step can be determined, even in the case where the wafer is divided by such a dividing method that particles are not deposited on the front surface of the wafer.

According to the dividing apparatus of the present invention, whether or not the wafer is divided after the modified layers have been properly formed in the modified layer forming step can be determined, even in the case where the wafer is divided in such a manner that particles do not deposit on the front surface of the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A wafer dividing method according to an embodiment of the present invention and a dividing apparatus to be used in the wafer dividing method will be described in detail below referring to the attached drawings.

Figure 1:
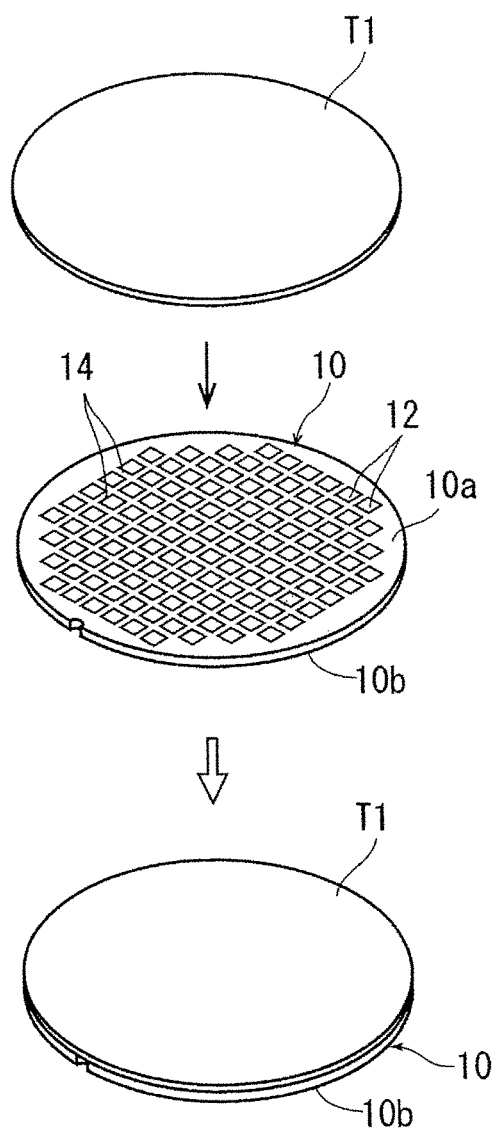
FIG. 1 is a perspective view depicting the manner in which a protective tape is attached to a wafer as a workpiece.

A workpiece to which the wafer dividing method of the present embodiment is to be applied is, for example, a wafer 10 as depicted in FIG. 1. The wafer 10 is a wafer of silicon (Si), and a wafer provided on a front surface 10a thereof with a plurality of devices 12 partitioned by a plurality of intersecting streets 14. A modified layer forming step of applying a laser beam of such a wavelength as to be transmitted through the wafer 10 is applied to the wafer 10 while positioning a condensing point of the laser beam to the inside of the wafer 10 corresponding to the streets 14, to form modified layers which will be starting points of division, will be described below.

Figure 2:
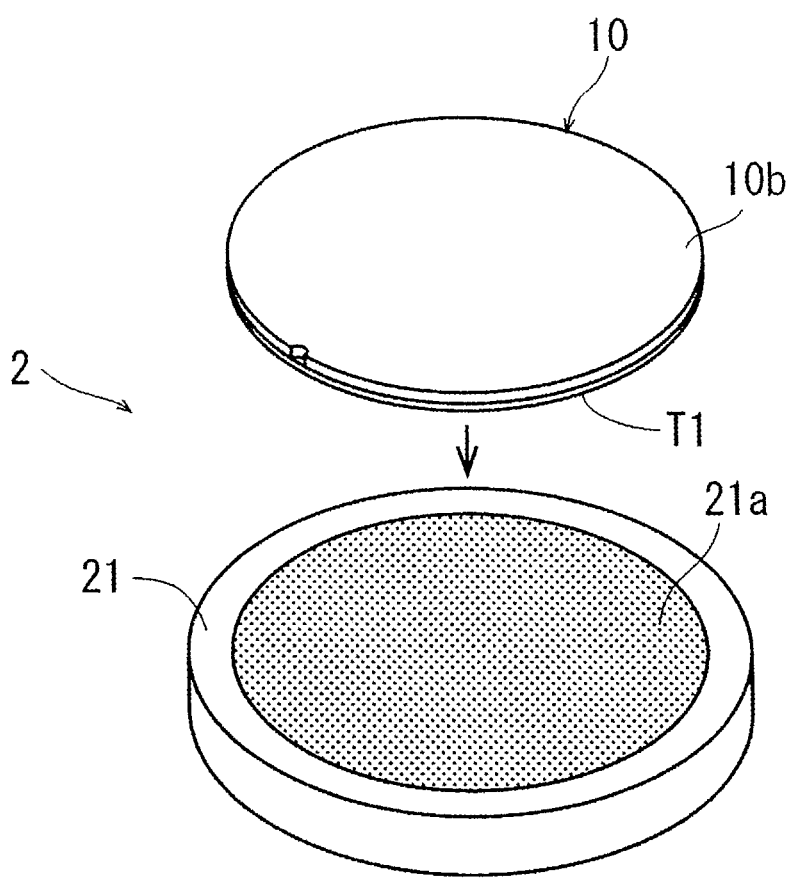
FIG. 2 is a perspective view depicting the manner in which the wafer of FIG. 1 is mounted on a chuck table of a laser processing apparatus.

In carrying out the modified layer forming step, first, as depicted in FIG. 1, a protective tape T1 is attached to the front surface 10a of the wafer 10 to unite them. The wafer 10 united with the protective tape T1 is fed to a laser processing apparatus 2 (only a part thereof is illustrated) depicted in FIG. 2, and is mounted on a chuck table 21, with the protective tape T1 side directed downward and with a back surface 10b side directed upward. The chuck table 21 includes a holding surface 21a on an upper side, and the holding surface 21a includes a gas-transmitting suction chuck. The holding surface 21a is connected to suction means which is omitted in illustration, and, by operating the suction means, the wafer 10 is held under suction onto the chuck table 21.

When the wafer 10 is held under suction on the chuck table 21, carried out as required is alignment in which position information concerning the streets 14 formed on the front surface 10a side of the wafer 10 is detected by use of an imaging unit (omitted in illustration) including an infrared charge coupled device (CCD) disposed in the laser processing apparatus 2. Next, a moving mechanism, which is omitted in illustration, is operated in reference to the position information concerning the streets 14, to position the chuck table 21 holding the wafer 10 directly below a beam condenser 23 of a laser beam applying unit 22, as depicted in FIG. 3. The laser beam applying unit 22 is a unit that includes an optical system which is omitted in illustration, emits a laser beam LB of such a wavelength as to be transmitted through the wafer 10, and applies the laser beam LB while adjusting the output to a predetermined output and condensing the laser beam LB. Note that the abovementioned moving mechanism includes a mechanism for moving the chuck table 21 in an X direction and in a Y direction orthogonal to the X direction, a mechanism for rotationally driving the chuck table 21, and a mechanism for moving the laser beam applying unit 22 in a Z direction orthogonal to the X direction and the Y direction.

Figure 3A:
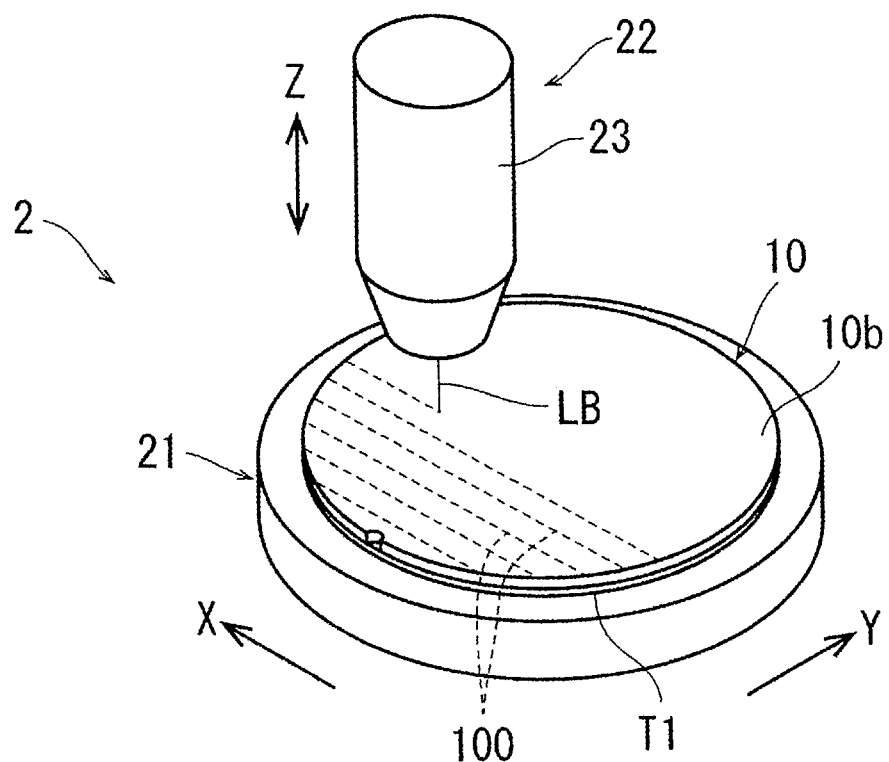
FIG. 3A is a perspective view depicting the manner in which a modified layer forming step is carried out.
Figure 3B:
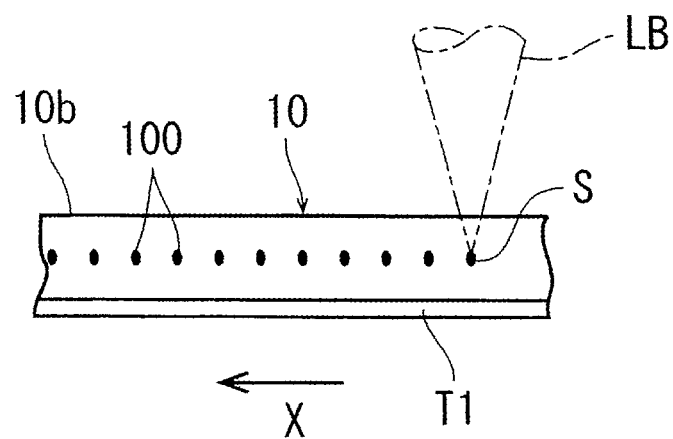
FIG. 3B is a partially enlarged sectional view of the wafer in the modified layer forming step.

When the wafer 10 is positioned directly below the beam condenser 23, as depicted in FIG. 3A, the laser beam applying unit 22 is operated, and the laser beam LB is applied to the wafer 10 with a condensing point S of the laser beam LB being positioned to the inside of the wafer 10 corresponding to the street 14 and the moving mechanism that relatively moves the beam condenser 23 and the chuck table 21 in the X direction (see FIG. 3B) being operated, to form a modified layer 100 which will be a starting point of division. By operating the moving mechanism to move the chuck table 21 in a processing feeding direction (X direction), an indexing feeding direction (Y direction) and a rotating direction, as required, the laser beam LB is applied along all the streets 14, whereby the modified layers 100 are formed along all the streets 14, and the modified layer forming step is completed.

The processing conditions for the laser processing carried out by the laser processing apparatus 2 are, for example, set as follows.

Figure 4A:
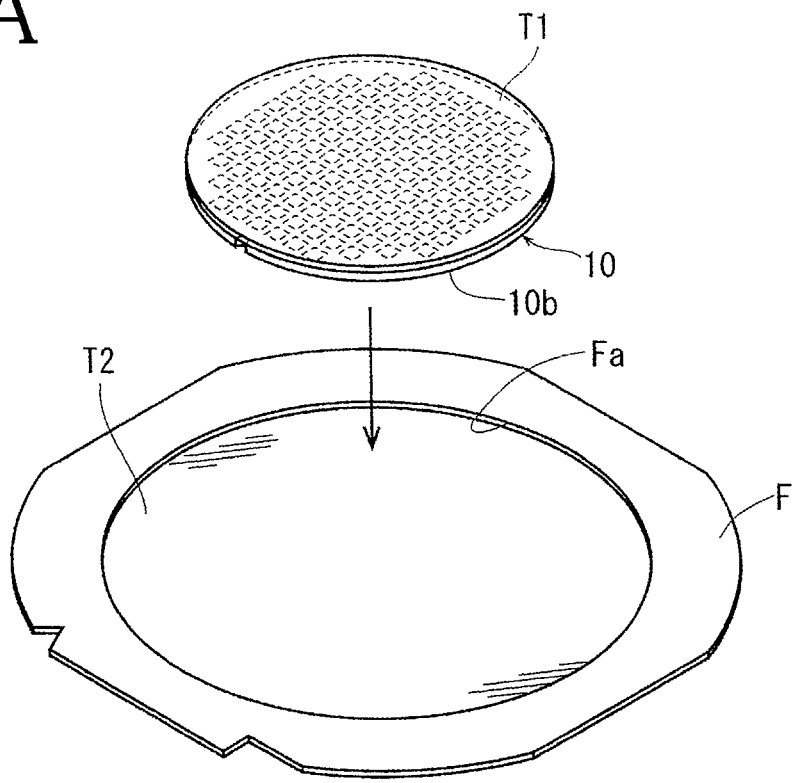
FIG. 4A is a perspective view depicting an embodiment of a frame disposing step.
Figure 4B:
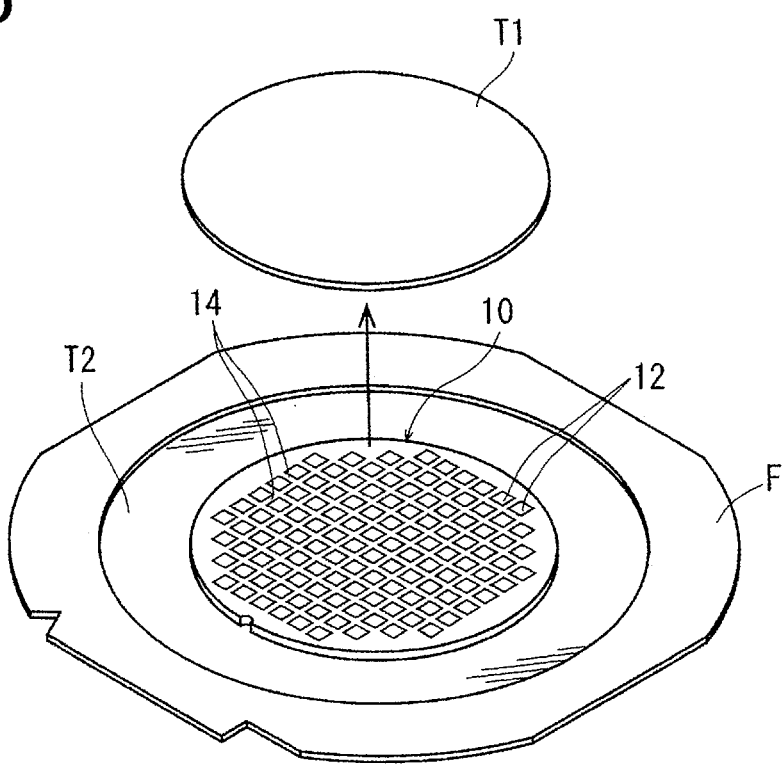
FIG. 4B is a perspective view depicting the manner in which the protective tape is peeled off from the wafer depicted in FIG. 4A.

Wavelength: 1,064 nm or 1,342 nm
Average output: 0.5 to 2.0 W
Repetition frequency: 60 to 90 kHz
Processing feeding speed: 200 to 1,000 mm/s When the modified layer forming step is carried out, as depicted in FIG. 4A, performed is a frame disposing step in which the wafer 10 is positioned at an opening Fa of a frame F provided in the center thereof with the opening Fa for accommodating the wafer 10 and the frame F and the wafer 10 are integrally attached together through a dicing tape T2. More specifically, a peripheral part of the dicing tape T2 having a pressure sensitive adhesive layer on a surface thereof is attached to a back surface of the frame F, the back surface 10b side of the wafer 10 is positioned at the center of the opening Fa of the frame F, and the frame F and the wafer 10 are integrally attached together in a state in which the protective tape T1 is exposed on the upper side. In the present embodiment, after the frame disposing step is carried out, as depicted in FIG. 4B, the protective tape T1 is peeled off and removed from the front surface 10a of the wafer 10.

Figure 5A:
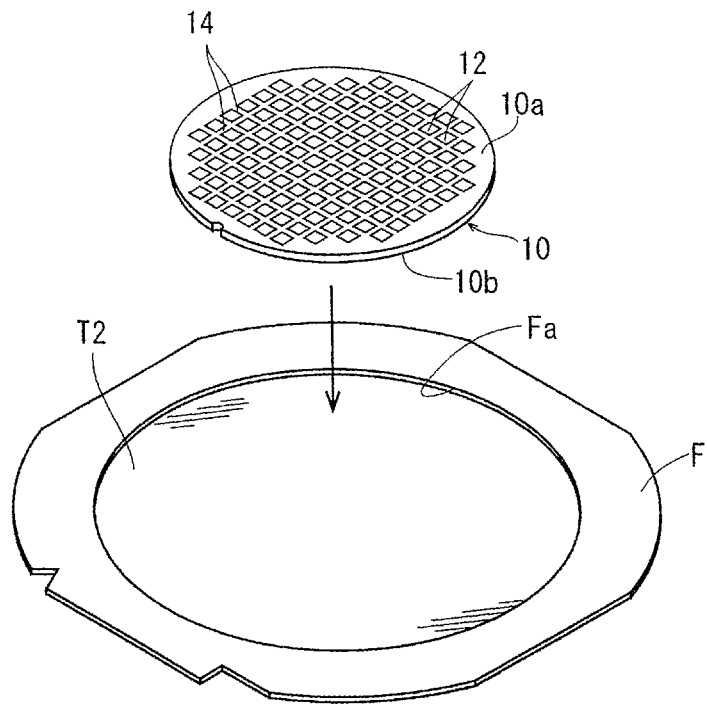
FIG. 5A is a perspective view depicting another embodiment of the frame disposing step.

Note that, while the frame disposing step is carried out after the modified layer forming step is performed in the above embodiment, the present invention is not limited to this; the frame disposing step may be carried out before the modified layer forming step. For example, as depicted in FIG. 5A, an unprocessed wafer 10 (a wafer 10 in the same state as the wafer 10 depicted in FIG. 1) for which the modified layer forming step has not yet been carried out and an annular frame F provided in its center with an opening Fa for accommodating the wafer 10 are prepared, the periphery of the dicing tape T2 having a pressure sensitive adhesive layer on its surface is attached to the back surface of the frame F, the back surface 10b side of the wafer 10 is positioned at the center of the opening Fa of the frame F, and the frame F and the wafer 10 are integrally attached in a state in which the front surface 10a of the wafer 10 is exposed on the upper side (frame disposing step).

Figure 5B:
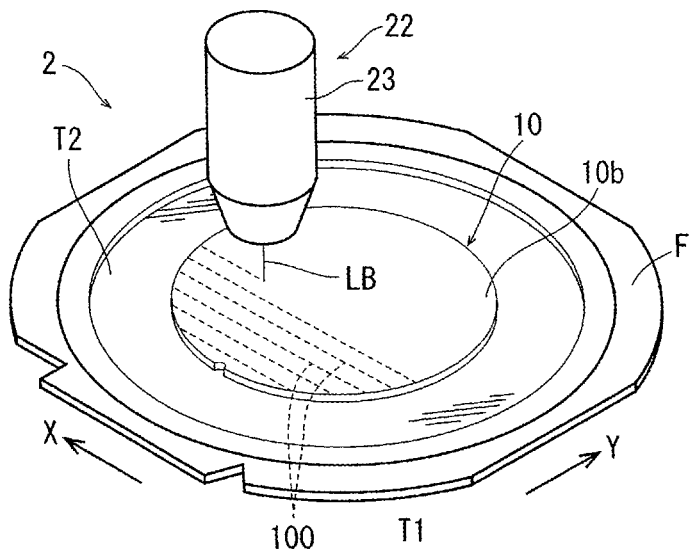
FIG. 5B is a perspective view depicting an embodiment in a case where the modified layer forming step is carried out after the frame disposing step depicted in FIG. 5A is performed.
Figure 5C:
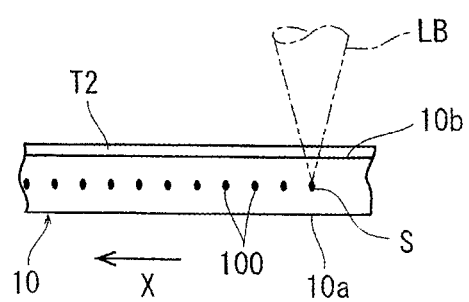
FIG. 5C is a partially enlarged sectional view of the modified layer forming step.

In the case where the frame disposing step is carried out before the modified layer forming step is conducted, after the frame disposing step is carried out, the wafer 10 held by the frame F is fed to the laser processing apparatus 2. Then, as depicted in FIG. 5B, the frame F is inverted upside down to position the wafer 10 side on the lower side, and the frame F is mounted on the chuck table 21, which is omitted in illustration, with the dicing tape T2 side directed upward, and is held under suction on the chuck table 21. Next, alignment is performed from the back surface 10b side of the wafer 10 in a manner similar to the one described above, the position of the street 14 of the wafer 10 is detected, and, while the moving mechanism is being operated, the laser beam LB of such a wavelength as to be transmitted through the wafer 10 is applied from the dicing tape T2 side along the street 14 with the condensing point S of the laser beam LB being positioned to the inside of the wafer 10 corresponding to the street 14, to form the modified layer (see FIG. 5C). In this way, the modified layers 100 which will be starting points of division are formed in the inside of the wafer 10 corresponding to all the streets 14 (see FIG. 5C), whereby the modified layer forming step is completed.

Even in the case where the frame disposing step is carried out before the modified layer forming step is conducted, it is preferable to attach the protective tape T1 to the front surface 10a of the wafer 10. Note that it is favorable that the laser processing conditions for the modified layer forming step to be carried out in the case where the frame disposing step is carried out before the modified layer forming step be set similar to the processing conditions for the modified layer forming step described referring to FIG. 3. In addition, in the above embodiment, the laser beam LB has been applied from the back surface 10b side of the wafer 10 in carrying out the modified layer forming step, but, in the case where test element group (TEG) and the like are not formed on the streets 14, the laser beam LB may be applied from the front surface 10a side of the wafer 10 to form the modified layers 100 in the inside of the wafer 10 corresponding to the streets 14.

When the modified layer forming step and the frame disposing step described above are carried out, conducted is a dividing step in which the wafer 10 is directed downward, the dicing tape T2 is expanded, and the wafer 10 is divided along the modified layers 100 formed along the streets 14 into individual device chips.

Figure 6:
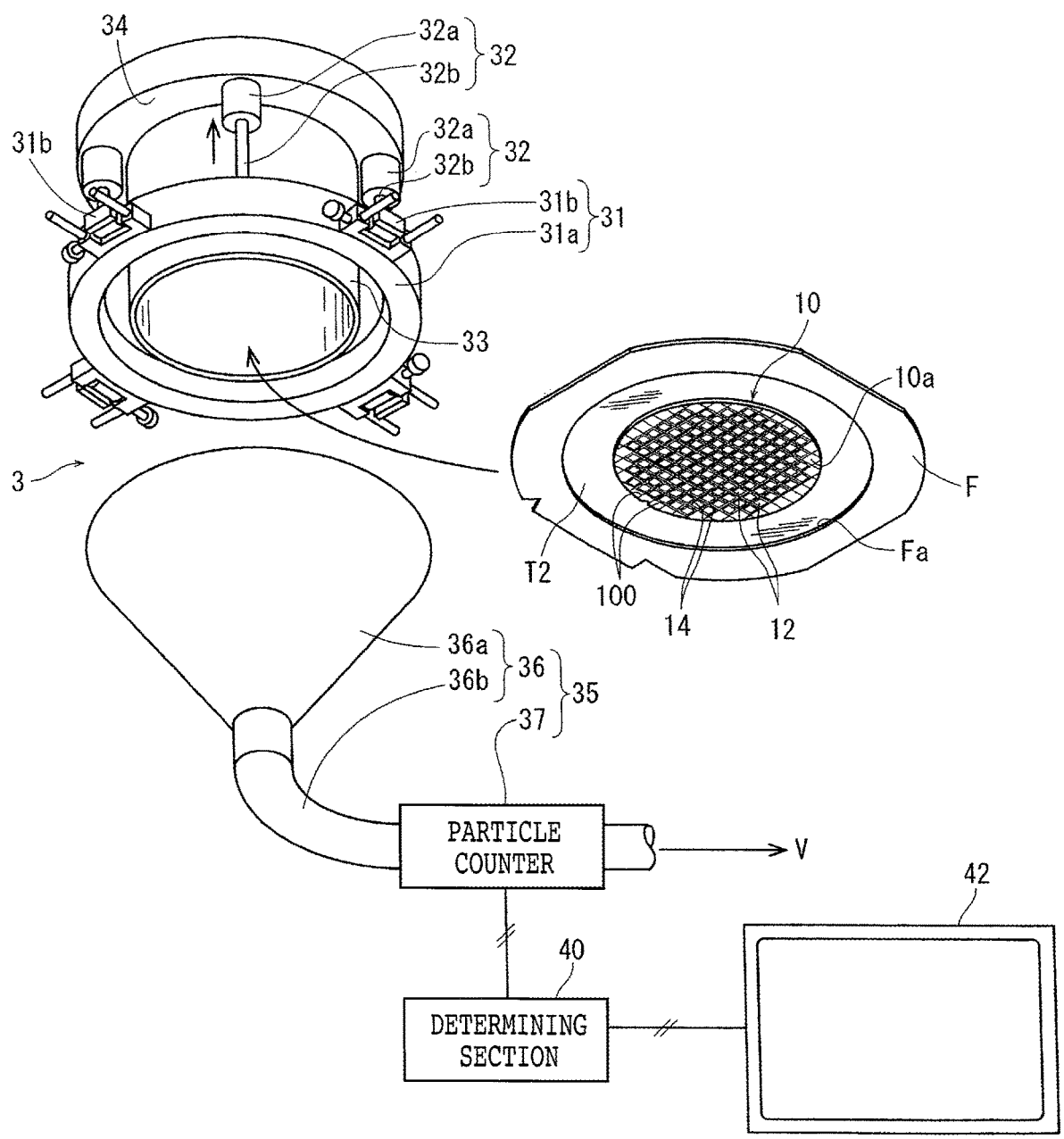
FIG. 6 is a perspective view, as viewed from an oblique lower side, of a dividing apparatus in the present embodiment.

Referring to FIG. 6, a dividing apparatus 3 suitable for carrying out the dividing step of the present embodiment will be described. As depicted in the figure, the dividing apparatus 3 is a dividing apparatus that positions the wafer 10 at the opening Fa of the frame F provided in its center with the opening Fa for accommodating the wafer 10, integrally attaches the frame F and the wafer 10 through the dicing tape T2, and divides, into individual device chips, the wafer 10 formed with the modified layers 100 as starting points of division in the inside of the wafer 10 corresponding to the plurality of streets 14 partitioning the plurality of devices 12. A more specific description will be given referring to FIG. 6.

The dividing apparatus 3 depicted in FIG. 6 includes a frame holding section 31 that holds the frame F supporting the wafer 10 side directed downward; a dividing section 32 that expands the dicing tape T2 attached to the frame F held by the frame holding section 31, to divide the wafer 10 into individual device chips; and a dust collection section 35 provided directly below the frame holding section 31, with a particle counter 37 for counting particles scattered from the wafer 10 divided.

The frame holding section 31 includes a frame holding member 31a formed in an annular shape for holding the annular frame F, and a plurality of (in the embodiment depicted, four) clamps 31b as fixing means disposed at regular intervals in the outer circumference of the frame holding member 31a. A lower surface of the frame holding member 31a is formed to be flat, and the frame F is mounted thereto. To prevent the frame F mounted to the lower surface of the frame holding member 31a from being dropped, the frame F is fixed to the lower surface of the frame holding member 31a by the clamps 31b.

On the inside of the annular frame holding member 31a, an expansion drum 33 having an upper end fixed to a base 34 and being fixed to the base 34 in a hanging manner is disposed. The base 34, for example, has an upper surface side fixed to a top wall of a housing (omitted in illustration) constituting the dividing apparatus 3. In plan view, the expansion drum 33 is smaller than the inside diameter of the opening Fa of the frame F but larger than the outside diameter of the wafer 10 supported by the dicing tape T2 mounted to the frame F. The dividing section 32 in the present embodiment includes air cylinders 32a that are disposed in plural number (for example, four) around the expansion drum 33 and that have upper ends fixed to the base 34; and piston rods 32b extending downward from the air cylinders 32a and having lower ends connected to an upper surface of the frame holding member 31a. The air cylinders 32a are supplied with control air, and, by the action of the air cylinders 32a, the piston rods 32b are advanced and retracted in the vertical direction, whereby the frame holding member 31a is advanced and retracted in the vertical direction.

The dust collection section 35 includes a dust collection path 36 and the particle counter 37. The dust collection path 36 includes an inverted conical dust collection cover 36a positioned directly below the frame holding member 31a; and a flexible pipe 36b connected to a bottom portion of the dust collection cover 36a. Suction means, which is omitted in illustration, is connected to the flexible pipe 36b, and, by operating the suction means, a suction negative pressure V is generated in the dust collection path 36. A dust collection box, which is omitted in illustration, is disposed at a final end portion of the dust collection path 36, and the particles having passed through the dust collection path 36 are accommodated in the dust collection box and are periodically discarded. The particle counter 37 is disposed on the flexible pipe 36b, and counts the particles passing through the dust collection path 36; for example, a laser beam is applied to the dust collection path 36, and the intensity of scattered light generated by collision of the laser beam on the particles (light intensity) is measured.

In the present embodiment, a determining section 40 is electrically connected to the particle counter 37. The determining section 40 includes, for example, a computer, to which an electrical signal indicative of the light intensity is inputted from the particle counter 37, whereby the size of the particles passing through the dust collection path 36 is measured in reference to the magnitude of the electrical signal (electric pulse), and, in reference to the number of the electrical signals, the particles passing through the dust collection path 36 can be counted. In other words, according to the particle counter 37 and the determining section 40 of the present embodiment, the number of the particles passing through the dust collection path 36 can be counted on a size basis. The information concerning the particles counted by the particle counter 37 and the result of determination made by the determining section 40 can be displayed on a display unit 42 connected to the determining section 40.

The dividing apparatus 3 of the present embodiment generally has the configuration described above, and, referring to FIG. 7 in addition to FIG. 6, the dividing step of dividing the wafer 10 into individual device chips 12' and the determining step in the present embodiment will be described.

Figure 7:
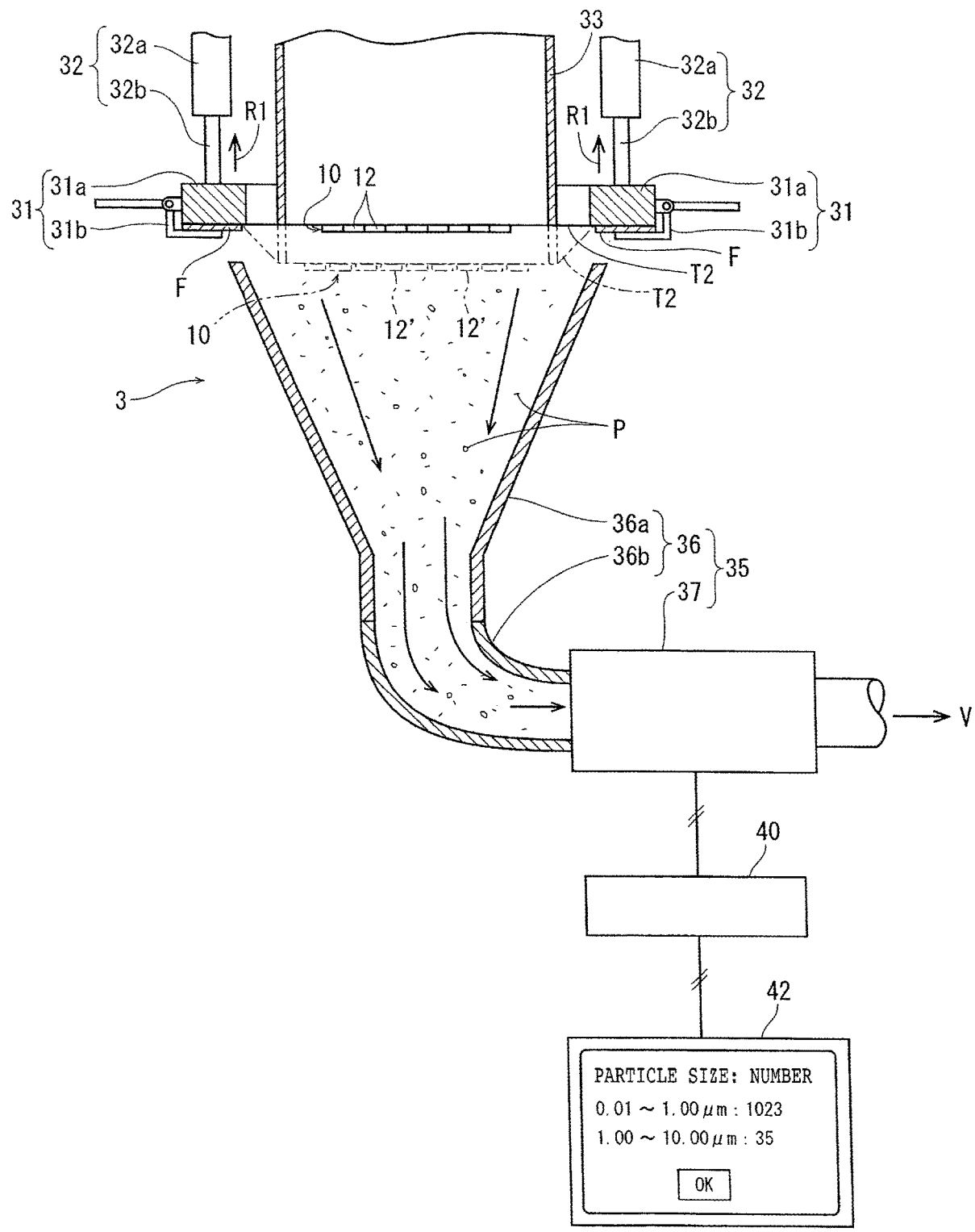
FIG. 7 is a partially enlarged sectional view depicting an embodiment of a dividing step and a determining step.

In carrying out the dividing step of the present embodiment, as depicted in FIG. 6, the frame F is mounted to the lower surface of the frame holding member 31a, with the front surface 10a side of the wafer 10 formed with the modified layers 100 along all the streets 14 directed downward, and the frame F is fixed by the clamps 31b. In this instance, as depicted in FIG. 7, the lower end of the expansion drum 33 is positioned at a reference position (indicated by a solid line) which is at substantially the same height as the lower surface of the frame holding member 31a. Next, the air cylinders 32a of the dividing section 32 are operated, to retract the piston rods 32b into the air cylinders 32a, whereby the frame holding member 31a is raised in the direction indicated by an arrow R1. As a result, the frame F is raised together with the frame holding member 31a, and the dicing tape T2 held by the frame F is expanded by the expansion drum 33 lowered relative to the frame holding member 31a (indicated by alternate long and two dashes line), whereby radial pulling forces act on the dicing tape T2. As a result, as depicted in FIG. 7, the wafer 10 is divided along the streets 14, and the device chips 12' are formed (dividing step).

In carrying out the dividing step in which the dividing section 32 is operated, the suction means, which is omitted in illustration, is operated, whereby a suction negative pressure V is generated in the dust collection path 36. As a result, the particles P scattered due to breakage of the modified layers 100 are dropped into the dust collection cover 36a of the dust collection path 36 positioned directly below the wafer 10 and are sucked. Here, as described above, the particle counter 37 is disposed on the flexible pipe 36b of the dust collection path 36, and, by the determining section 40 to which electrical signals are sent from the particle counter 37, the size of the particles P passing through the particle counter 37 and the number of the particles P are measured or counted.

Acceptance (OK) conditions for the number of particles, in the case where the dividing step is carried out in a state in which the modified layers 100 have been favorably formed along the streets 14 of the wafer 10, are stored in the determining section 40 in the modified layer forming step. The acceptance conditions can be determined by experiments. The acceptance conditions for the number of particles refer to, for example, the case where the following conditions (1) and (2) are satisfied, where N1 is the number of small particles (0.01 to 1.00 μm) and N2 is the number of large particles (1.00 to 10.00 μm).

$$500 < N1 < 2,000 \quad (1)$$

$$0 < N2 < 50 \quad (2)$$

Note that the abovementioned acceptance conditions are to be modified according to the material, size, and thickness of the wafer, laser processing conditions, and the like, and the abovementioned conditions (1) and (2) are merely an example. In addition, depending on the quality demanded, further, the particle size condition may be further finely set, and three or more conditions may be set.

As described above, the size of the particles P passing through the dust collection path 36 and the number of the particles P are measured and counted by the particle counter 37, and are then determined by the determining section 40. Then, in the case where the particle number satisfies the acceptance conditions (1) and (2) and where it is determined that the modified layers have been properly formed, the determination result (in the present embodiment, "OK") is displayed together with the size and number of the particles on the display unit 42, as depicted in FIG. 7.

According to the wafer dividing method and the dividing apparatus of the above embodiment, even in the case where the wafer is divided to form the device chips in a state in which the particles are not accumulated on the surface of the wafer, it can be determined whether or not the modified layers have been properly formed in the modified layer forming step and the wafer has been divided.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer dividing method for dividing, into individual device chips, a wafer formed on a front surface thereof with a plurality of devices partitioned by a plurality of intersecting streets, the wafer dividing method comprising:
   a modified layer forming step of applying a laser beam of such a wavelength as to be transmitted through the wafer to the wafer while positioning a condensing point of the laser beam to an inside of the wafer corresponding to the streets, to form modified layers that will be starting points of division;
   a frame disposing step of positioning the wafer at an opening of a frame provided in a center thereof with the opening for accommodating the wafer, and integrally attaching the frame and the wafer together through a dicing tape, before or after the modified layer forming step;
   a dividing step of directing the wafer downward and expanding the dicing tape to divide, into individual device chips, the wafer along the modified layers formed in the inside of the wafer corresponding to the streets; and
   a determining step of counting particles scattered at a time of division of the wafer by a particle counter disposed in a dust collection path set directly below the wafer, and determining, on a basis of the number of the particles counted by the particle counter that are within a first predetermined particle size range, whether or not the modified layers have been properly formed, at a time of carrying out the dividing step based on whether the number of particles within the first predetermined particle size range is within a first predetermined quantity range.

2. The wafer dividing method according to claim 1, further comprising determining, on a basis of the number of the particles counted by the particle counter that are within a second predetermined particle size range, whether or not the modified layers have been properly formed, at a time of carrying out the dividing step based on whether the number of particles within the second predetermined particle size range is within a second predetermined quantity range.

3. The wafer dividing method according to claim 2, wherein the first predetermined particle size range is between 0.01 µm and 1.00 µm.

4. The wafer dividing method according to claim 3, wherein the second predetermined particle size range is between 1.00 µm and 10.00 µm.

5. The wafer dividing method according to claim 1, wherein, in the determining step, a laser beam is applied to the dust collection path, and an intensity of scattered light generated by collision of the laser beam with the particles is measured by the particle counter.

6. The wafer dividing method according to claim 5, wherein a determining section is connected to the particle counter, such that, in the determining step, the determining section receives an electrical signal indicative of the light intensity from the particle counter, whereby the size of the particles passing through the dust collection path is measured in reference to the magnitude of the electrical signal.

* * * * *